(12) United States Patent
Hashimoto et al.

(10) Patent No.: US 10,212,823 B2
(45) Date of Patent: Feb. 19, 2019

(54) WIRING FORMING METHOD AND CIRCUIT BOARD

(71) Applicant: FUJI CORPORATION, Chiryu-shi (JP)

(72) Inventors: Yoshitaka Hashimoto, Kariya (JP); Masatoshi Fujita, Anjo (JP); Kenji Tsukada, Toyota (JP); Akihiro Kawajiri, Chiryu (JP); Masato Suzuki, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/523,733

(22) PCT Filed: Nov. 7, 2014

(86) PCT No.: PCT/JP2014/079539
§ 371 (c)(1),
(2) Date: May 2, 2017

(87) PCT Pub. No.: WO2016/072010
PCT Pub. Date: May 12, 2016

(65) Prior Publication Data
US 2017/0318681 A1    Nov. 2, 2017

(51) Int. Cl.
*H05K 3/12*    (2006.01)
*C23C 14/58*    (2006.01)

(52) U.S. Cl.
CPC ........... *H05K 3/1283* (2013.01); *C23C 14/58* (2013.01); *H05K 3/125* (2013.01); *H05K 3/1291* (2013.01);
(Continued)

(58) Field of Classification Search
CPC .............................. H05K 3/12; H05K 3/1283
See application file for complete search history.

(56) References Cited

U.S. PATENT DOCUMENTS 5,883,437 A    3/1999    Maruyama et al.

FOREIGN PATENT DOCUMENTS

DE    10 2011 100 558 A1    6/2012
DE    10 2012 009 345 A1    11/2013
(Continued)

OTHER PUBLICATIONS

Office Action dated Jun. 27, 2018 in corresponding Japanese Patent Application No. 2016-557419 (with English Translation), 11 pages.
(Continued)

*Primary Examiner* — Jeremy C Norris
(74) *Attorney, Agent, or Firm* — Oblon, McClelland, Maier & Neustadt, L.L.P.

(57) ABSTRACT

To form wiring on circuit board and conductor body, metal ink containing metal particles is dispensed by inkjet head straddling the circuit board and the conductor body. Then, a laser is applied by laser emitting device to the dispensed metal ink. The metal ink to which the laser is applied is baked and wiring is formed. A laser corresponding to the laser emission amount per unit of area based on the material of the circuit board, which is resin, is applied to the metal ink on the circuit board, and a laser corresponding to the laser emission amount per unit of area based on the conductor body is applied to the metal ink on the conductor body. The metal ink on the circuit board and the metal ink on the conductor body is baked appropriately, and wiring is formed appropriately straddling the circuit board and the conductor body.

8 Claims, 5 Drawing Sheets

(52) U.S. Cl.
CPC . *H05K 2201/035* (2013.01); *H05K 2203/107* (2013.01)

(56) References Cited

FOREIGN PATENT DOCUMENTS

| | | |
|---|---|---|
| JP | 8-203898 A | 8/1996 |
| JP | 2006-59942 A | 3/2006 |
| JP | 2009-16724 A | 1/2009 |
| JP | 2014-185358 A | 10/2014 |

OTHER PUBLICATIONS

Extended European Search Report dated Oct. 13, 2017 in Patent Application No. 14905484.3.
International Search Report dated Feb. 3, 2015 in PCT/JP2014/079539 filed Nov. 7, 2014.

WIRING FORMING METHOD AND CIRCUIT BOARD

TECHNICAL FIELD

The present application relates to a wiring forming method for forming wiring on a substrate by baking a metal-containing liquid that is a liquid containing metal particles, and to a circuit board formed by the method.

BACKGROUND ART

In recent years, as disclosed in the patent literature below, technology has been developed that forms wiring on a circuit board by baking a metal-containing liquid that is a liquid containing metal particles. Specifically, for example, metal-containing liquid is applied between multiple conductor bodies such as electrodes provided on a circuit board, and a laser is applied to the metal-containing liquid. This bakes the metal-containing liquid and thereby forms the wiring.

Patent Literature 1: JP-A-2006-059942

SUMMARY

According to the above patent literature, it is possible to appropriately form wiring on a circuit board to a certain extent. However, there are cases in which wiring cannot be formed appropriately it for example, in addition to a gold or copper conductor body, a conductor body of resin or the like is formed on the circuit board, and the wiring is to be formed straddling the conductor body and the resin. Specifically, because the thermal conductivity of conductor bodies is high, when a laser is applied to a metal-containing liquid on a conductor body, the heat from the laser is easily transferred to the conductor body and dissipated. Due to this, the laser emission amount (hereinafter also referred to as "emission amount for conductor body") per unit of area required to bake the metal-containing liquid on the conductor body is relatively high. On the other hand, because the thermal conductivity of resins is low, when a laser is applied to a metal-containing liquid on a resin, the heat from the laser is not easily transferred to the resin and dissipated. Due to this, the laser emission amount (hereinafter also referred to as "emission amount for resin") per unit of area required to bake the metal-containing liquid on the resin is relatively low.

Thus, for example, in a case in which a laser corresponding to the emission amount for conductor body is applied to a metal-containing liquid on a conductor body and a resin, the metal-containing liquid on the conductor body is baked and the wiring is formed appropriately. On the other hand, although the metal-containing liquid on the resin is baked, there is a worry that the wiring formed by the baking will be damaged due to excessive heat. Further, in a case in which a laser corresponding to the emission amount for resin is applied to a metal-containing liquid on a conductor body and a resin, the metal-containing liquid on the resin is baked and the wiring is formed appropriately. However, there is a worry that the metal-containing liquid on the conductor body will not be baked and the wiring not formed. The present disclosure takes account of such problems and an object thereof is to provide technology for appropriately forming wiring that straddles different types of substrate materials.

To solve the above problem, a wiring forming method according to the present disclosure includes forming wiring on a substrate by baking a metal-containing liquid that is a liquid containing metal particles, wherein the forming includes applying the metal-containing liquid straddling multiple different types of substrate materials, and baking the metal-containing liquid applied during the applying with a laser, wherein the laser emission amount per unit of area is changed based on the substrate material for each of the multiple substrates when baking the metal-containing liquid.

Also, a circuit board according to the present disclosure includes multiple substrates of different materials, with wiring formed on the substrates by baking with a laser metal-containing liquid that is a liquid containing metal particles that is applied straddling the multiple substrates, wherein a laser emission amount per unit of area when baking the metal-containing liquid is different for each of the multiple substrates based on the material of the substrate.

Advantageous Effects

With the circuit board and the wiring forming method according to the present disclosure, when baking a metal-containing liquid, the laser emission amount per unit of area is changed for each of the multiple different materials of substrate based on the material of the substrates. That is, for example, a laser corresponding to the emission amount for conductor body is applied to the metal-containing liquid on the conductor body, and a laser corresponding to the emission amount for resin is applied to the metal-containing liquid on the resin. By this, it is possible to appropriately form wiring straddling multiple substrates of different materials.

DESCRIPTION OF PREFERRED EMBODIMENTS

The following describes in detail referring to the figures example embodiments of the present disclosure.

Board Work Device Configuration

Figure 1:
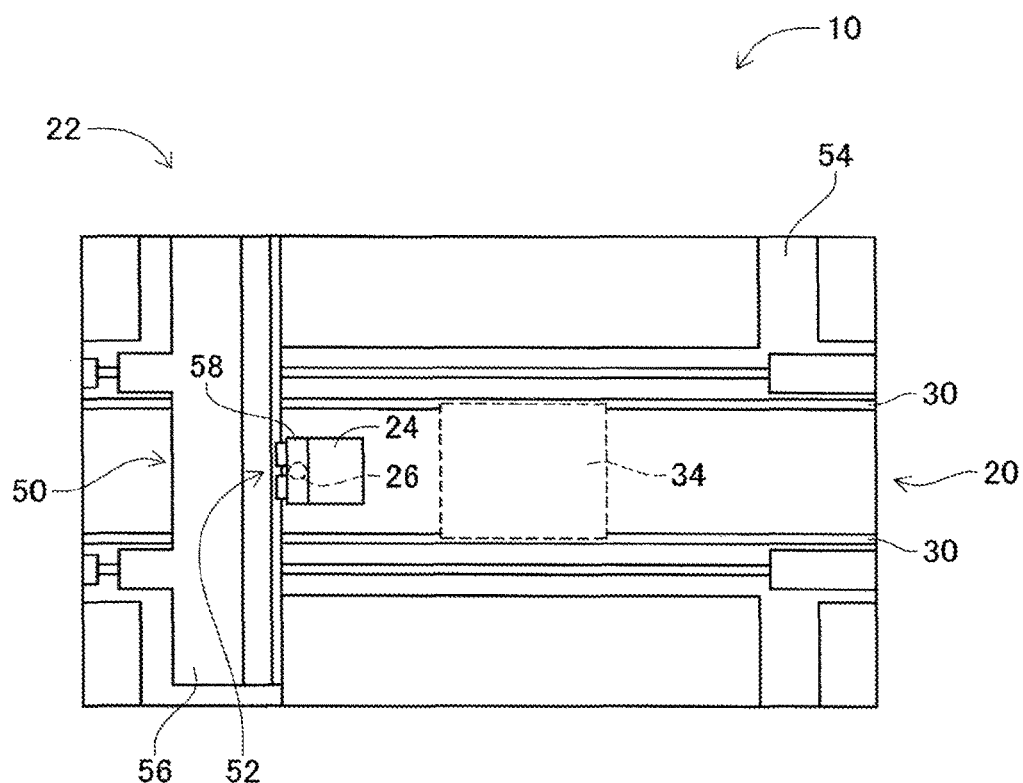
FIG. 1 is a plan view of a board work device.
Figure 1:
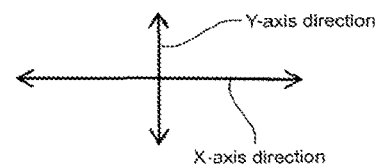

FIG. 1 shows board work device 10 that is an embodiment of the present disclosure. Board work device 10 is provided with conveyance device 20, head moving device 22, inkjet head 24, and laser emitting device 26.

Conveyance device 20 has a pair of conveyor belts 30 extending in the X-axis direction and an electromagnetic motor (not shown) for turning the conveyor belts 30. The pair of conveyor belts 30 support circuit board 34 and circuit board 34 is conveyed in the X-axis direction by the driving of the electromagnetic motor. Also, conveyance device 20 has a holding device (not shown). The holding device fixedly holds circuit board 34 supported by conveyor belts 30 in a predetermined position (the position at which circuit board 34 is shown in FIG. 1).

Head moving device 22 is configured from X-axis direction slide mechanism 50 and Y-axis direction slide mechanism 52. X-axis direction slide mechanism 50 has X-axis slider 56 provided on base 54 so as to be movable in the X-axis direction. X-axis slider 56 is moved to any position in the X-axis direction by the driving of an electromagnetic motor (not shown). In addition, Y-axis direction slide mechanism 52 has Y-axis slider 58 provided on a side surface of X-axis slider 56 so as to be movable in the Y-axis direction. Y-axis slider 58 is moved to any position in the Y-axis direction by the driving of an electromagnetic motor (not shown). Inkjet head 24 is attached to Y-axis slider 58. According to such a structure, inkjet head 24 is moved to any position on base 54 by head moving device 22.

Inkjet head 24 has a dispensing outlet (not shown) formed on a lower surface and metal ink is dispensed on circuit board 34 from that dispensing outlet. The metal ink is a material with metal particles in a solution, and, as described in detail below, forms wiring by being baked by a laser of laser emitting device 26.

Laser emitting device 26 is a device that emits a laser, and is fixed to the lower surface of Y-axis slider 58 in a state facing downwards. Accordingly, Y-axis slider 58 is able to apply the laser to any position on circuit board 34 by being moved by head moving device 22. Note that, laser emitting device 26 is provided with a laser capable of emitting a usable wavelength, with the laser strength being freely changeable.

Forming of Wiring on the Circuit Board

Figure 2:
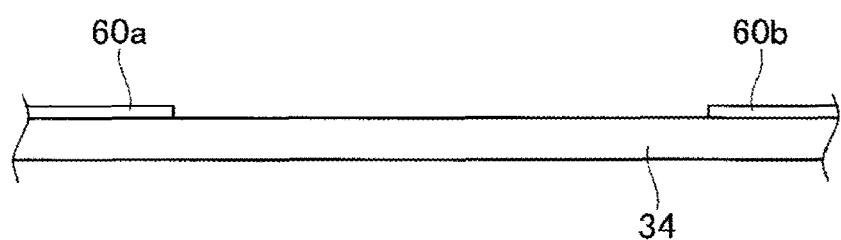
FIG. 2 is a side view of a circuit board.
Figure 3:
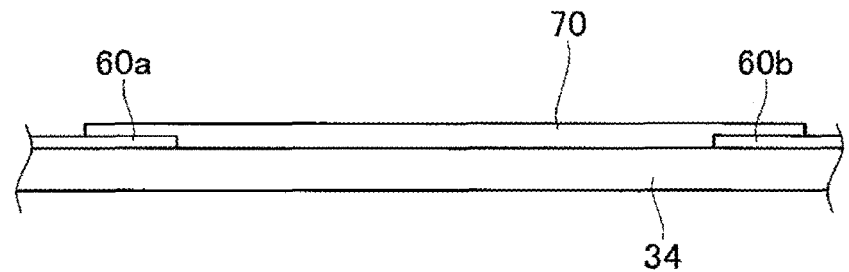
FIG. 3 is a side view of a circuit board onto which a metal ink has been dispensed.

Board work device 10, according to the above configuration, forms wiring on circuit board 34 such that multiple conductor bodies such as electrodes formed on the circuit board are connected by the wiring. In detail, as shown in FIG. 2, multiple conductor bodies 60*a* and 60*b* are arranged on circuit board 34. And, by operation of head moving device 22, inkjet head 24 is moved from above conductor body 60*a* to above conductor body 60*b*. During this movement, inkjet head 24 dispenses metal ink. By this, as shown in FIG. 3, conductor body 60*a* and conductor body 60*b* are connected by metal ink 70. Then, metal ink 70 is baked to form wiring by a laser being applied to metal ink 70 by laser emitting device 26. Note that, baking of metal ink is a phenomenon that, by applying energy, performs vaporization of solvent or breakdown of metal particle protective coating, and increases conductivity by making the metal particles contact or fuse. Metal wiring is formed by metal ink 70 being baked.

However, metal ink 70 may not form wiring appropriately due to being dispensed onto different materials, that is, conductor bodies 60*a* and 60*b*, and circuit board 34. In detail, because the thermal conductivity of conductor bodies 60*a* and 60*b* is high, when laser is applied to metal ink 70 dispensed on conductor bodies 60*a* and 60*b*, the heat from the laser is easily transferred to conductor bodies 60*a* and 60*b* and dissipated. Due to this, the laser emission amount (hereinafter also referred to as "emission amount for conductor body") per unit of area required to bake metal ink 70 dispensed on conductor bodies 60*a* and 60*b* is relatively high. On the other hand, circuit board 34 is made of a resin substance, and because the thermal conductivity of the resin is low, when a laser is applied to metal ink 70 dispensed on circuit board 34, the heat from the laser is not easily transferred to circuit board 34 and dissipated. Due to this, the laser emission amount (hereinafter also referred to as "emission amount for resin") per unit of area required to bake metal ink 70 dispensed on circuit board 34 is relatively low.

Thus, for example, in a case in which a laser corresponding to the emission amount for conductor body is applied to the entire metal ink 70 dispensed on conductor bodies 60*a* and 60*b* and circuit board 34, metal ink 70 dispensed on conductor bodies 60*a* and 60*b* is baked and the wiring is formed appropriately. On the other hand, although metal ink 70 dispensed on circuit board 34 is baked, there is a worry that the wiring formed by the baking will be damaged due to excessive heat. Further, there is a worry that circuit board 34 will be damaged.

Further, in a case in which a laser corresponding to the emission amount for resin is applied to the entire metal ink 70 dispensed on conductor bodies 60*a* and 60*b* and circuit board 34, metal ink 70 dispensed on circuit board 34 is baked and the wiring is formed appropriately. However, there is a worry that metal ink 70 dispensed on conductor bodies 60*a* and 60*b* will not be baked and the wiring not formed.

Therefore, with board work device 10, a laser corresponding to the emission amount for conductor body is applied to metal ink 70 dispensed on conductor bodies 60*a* and 60*b*, and a laser corresponding to the emission amount for resin is applied to metal ink 70 dispensed on circuit board 34. However, when the emission amount is changed at the boundary between metal ink 70 dispensed on conductor bodies 60*a* and 60*b* and metal ink 70 dispensed on circuit board 34, both a laser corresponding to the emission amount for conductor body and a laser corresponding to the emission amount for resin are applied. Therefore, there is a worry that a laser corresponding to the emission amount for conductor body will be applied to a conductor body 60*a* and 60*b* side end section of metal ink 70 dispensed on circuit board 34 (hereinafter also referred to as "metal-ink-on-resin end section") and the metal-ink-on-resin end section will be damaged.

Taking account of this, with board work device 10, a laser corresponding to the emission amount for resin is applied to metal ink 70 dispensed on circuit board 34. Specifically, because the laser emission amount per laser unit of area is defined by multiplying the laser strength by the laser emission time per unit of area, in a case in which the laser emission time per unit of area is specified time t1, a laser of strength A applied to metal ink 70 dispensed on circuit board 34 has a value of emission amount for resin X excluding specified time t1. Note that, laser emitting device 26 is moved such that the laser is applied to metal ink 70 of the unit of area for specified time t1. That is, the moving speed of laser emitting device 26, in other words, the traverse speed of laser emitting device 26 due to head moving device 22, is L/t1. That is, L is a constant.

Figure 4:
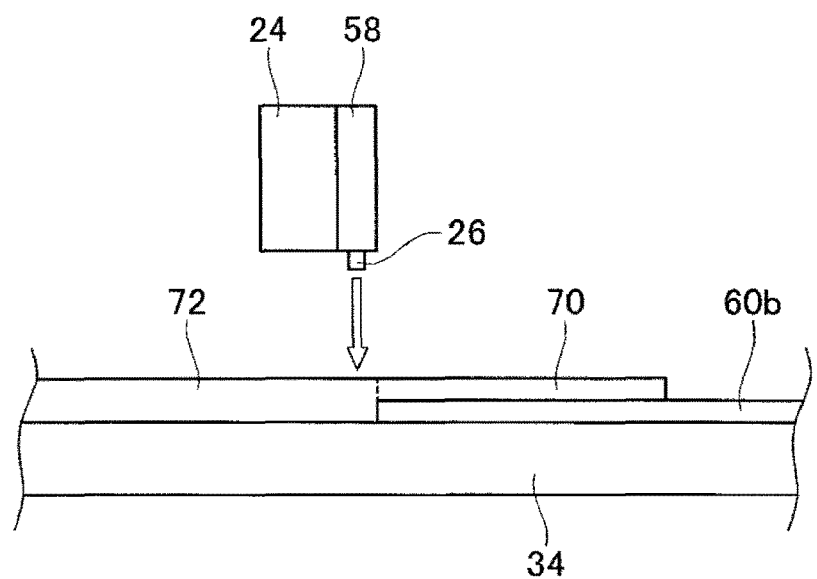
FIG. 4 is a side view showing a circuit board with the metal ink on the circuit board baked.

Due to this, when the laser is applied to metal ink 70 dispensed on circuit board 34, laser emitting device 26 emits a laser with laser strength A while moving at speed L/t1. By this, a laser corresponding to emission amount for resin X is applied to metal ink 70 dispensed on circuit board 34 as shown in FIG. 3, and, as shown in FIG. 4, wiring 72 is formed on circuit board 34 by metal ink 70 dispensed on circuit board 34 being baked. Note that, in FIG. 4, the boundary section between circuit board 34 and conductor body 60*b* is shown. Also, the wavelength of the laser applied to metal ink 70 is 500 to 1500 nm. This wavelength is a wavelength for which absorption by the metal particles in metal ink 70 is easy, therefore metal ink 70 is baked appropriately.

And, after metal ink 70 dispensed on circuit board 34 has been baked, the laser strength is changed from laser strength A based on emission amount for resin X to laser strength B based on emission amount for conductor body Y. Note that, laser strength B based on emission amount for conductor body Y is a value of emission amount for conductor body Y excluding specified time t1, and emission amount for conductor body Y is larger than emission amount for resin X. Therefore, laser strength B based on emission amount for conductor body Y is larger than laser strength A based on emission amount for resin X.

By this, a laser with laser strength B that is higher than laser strength A based on emission amount for resin X is applied to the boundary between metal ink 70 dispensed on conductor body 60b and metal ink 70 dispensed on circuit board 34, but because the metal ink 70 dispensed on circuit board 34 is being baked, damage to the metal-ink-on-resin end section is prevented. In detail, the wavelength of the laser applied to metal ink 70, as given above, is 500 to 1500 nm, and this wavelength is easily absorbed by the metal particles. In other words, the metal-ink-on-resin end section becomes a mass of metal by the baking of the metal particles, that is, becomes wiring 72, with lower ability to absorb the laser. Therefore, even though a laser with a laser strength B that is higher than laser strength A is applied, damage to the metal-ink-on-resin end section is prevented.

Figure 5:
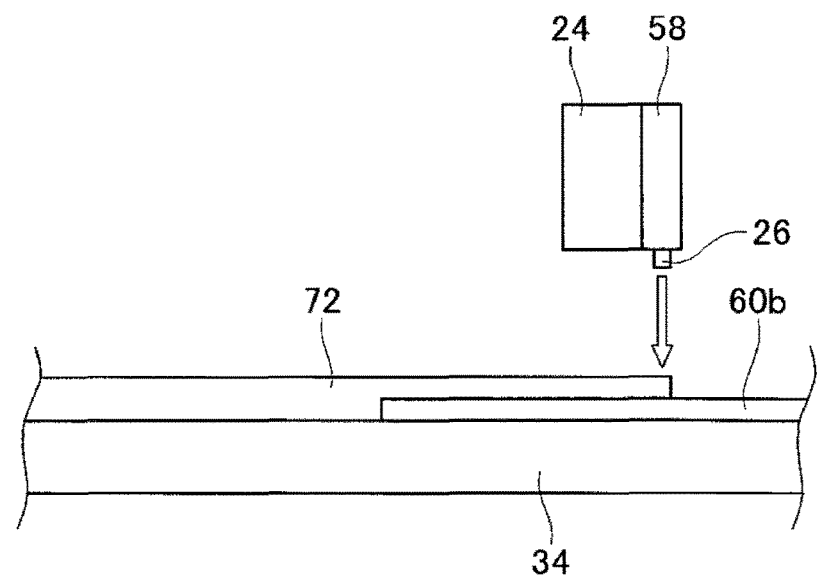
FIG. 5 is a side view showing a circuit board with the metal ink on the circuit board and a conductor body baked.

Also, the laser is applied to metal ink 70 dispensed on conductor body 60b after the laser strength has been changed from laser strength A based on emission amount for resin X to laser strength B based on emission amount for conductor body Y. The traverse speed of laser emitting device 26 in this case is the same as the case of the laser applied to metal ink 70 dispensed on circuit board 34, that is, L/t1. By this, a laser corresponding to emission amount for conductor body Y is applied to metal ink 70 dispensed on conductor body 60b, and by the metal ink 70 dispensed on conductor body 60b being baked, as shown in FIG. 5, wiring 72 is formed on conductor body 60b.

That is, with board work device 10, after wiring 72 is formed on circuit board 34 by a laser corresponding to emission amount for resin X being applied to metal ink 70 dispensed on circuit board 34, wiring 72 is formed on conductor bodies 60a and 60b by a laser corresponding to emission amount for conductor body Y being applied to metal ink dispensed on conductor bodies 60a and 60b. Accordingly, it is possible to appropriately bake metal ink 70 dispensed straddling conductor bodies 60a and 60b and circuit board 34 and form wiring 72 while preventing damage to the metal-ink-on-resin end section.

Alternative Embodiment 1

With the above embodiment, when a laser is applied to metal ink 70 dispensed on circuit board 34 and when a laser is applied to metal ink 70 dispensed on conductor bodies 60a and 60b, it is possible to change the laser strength without changing the traverse speed of the laser emitting device, and to change the traverse speed of the laser emitting device without change the laser strength.

Specifically, when the laser is applied to metal ink 70 dispensed on circuit board 34, laser emitting device 26 emits a laser with laser strength A while moving at speed L/t1. By this, a laser corresponding to emission amount for resin X is applied to metal ink 70 dispensed on circuit board 34, and, as shown in FIG. 4, wiring 72 is formed on circuit board 34. Then, a laser is applied to metal ink 70 dispensed on conductor body 60b, but here, the traverse speed of laser emitting device 26 is changed without changing the laser strength.

In detail, to apply a laser corresponding to emission amount for conductor body Y, which is larger than emission amount for resin X, it is necessary to apply the laser with a laser strength A for time t2 that is longer than specified time t1. Therefore, the traverse speed of laser emitting device 26 becomes L/t2, which is slower than traverse speed L/t1 of laser emitting device 26 when applying the laser to metal ink 70 dispensed on circuit board 34. That is, when the laser is applied to metal ink 70 dispensed on circuit board 34, laser emitting device 26 emits a laser with laser strength A while moving at speed L/t2. By this, a laser corresponding to emission amount for conductor body Y is applied to metal ink 70 dispensed on conductor body 60b, and, as shown in FIG. 5, wiring 72 is formed on conductor body 60b. In this manner, it is possible to achieve the same effects as with the first embodiment by changing the traverse speed of laser emitting device 26. Further, with this first alternative embodiment, because the laser strength applied to metal ink 70 dispensed on conductor body 60b is low relative to the first embodiment, it is possible to even more effectively prevent damage to the metal-ink-on-resin end section.

Alternative Embodiment 2

Further, in the first embodiment above, when a laser is applied to metal ink dispensed on conductor bodies 60a and 60b, a laser is applied once from one end to the other end of metal ink 70 dispensed on conductor bodies 60a and 60b, but a laser may be applied multiple times to and from one end to the other end of metal ink 70 dispensed on conductor bodies 60a and 60b.

Specifically, when the laser is applied to metal ink 70 dispensed on circuit board 34, laser emitting device 26 emits a laser with laser strength A while moving at speed L/t1. By this, a laser corresponding to emission amount for resin X is applied to metal ink 70 dispensed on circuit board 34, and, as shown in FIG. 4, wiring 72 is formed on circuit board 34. Then, although a laser is applied to metal ink 70 dispensed on conductor body 60b, the laser strength in this case is less than less laser strength B and greater than laser strength A.

Also, laser emitting device 26 traverses from the circuit board 34 side of metal ink 70 dispensed on conductor body 60b to the opposite end section. In addition, laser emitting device 26 traverses from the opposite end section of metal ink 70 dispensed on conductor body 60b to the original end section. Here, laser emitting device 26 repeatedly traverses to and from one end to the other end of metal ink 70 until a laser corresponding to emission amount for conductor body Y has been applied to metal ink 70 dispensed on conductor body 60b. By this, a laser corresponding to emission amount for conductor body Y is applied to metal ink 70 dispensed on conductor body 60b, and by the metal ink 70 dispensed on conductor body 60b being baked, as shown in FIG. 5, wiring 72 is formed on conductor body 60b. Note that, the traverse speed of laser emitting device 26 when the laser is being applied to metal ink 70 dispensed on conductor body 60b can be set to any speed, but the slower the traverse speed of laser emitting device 26, the fewer times the laser needs to be applied from one end to the other end of metal ink 70.

In this manner, by applying a laser multiple times to and from one end to the other end of metal ink 70 dispensed on conductor body 60b, the same effects as the first embodiment can be achieved.

Alternative Embodiment 3

Also, in the second alternative embodiment above, a laser is applied multiple times to and from one end to the other end of metal ink 70 dispensed on conductor bodies 60a and 60b, but a laser may be applied multiple times to the circuit board 34 end of metal ink 70 dispensed on conductor bodies 60a and 60b (hereinafter also referred to as "metal-ink-on-conductor-body end section").

Specifically, when the laser is applied to metal ink 70 dispensed on circuit board 34, laser emitting device 26 emits a laser with laser strength A while moving at speed L/t1. By this, a laser corresponding to emission amount for resin X is applied to metal ink 70 dispensed on circuit board 34, and, as shown in FIG. 4, wiring 72 is formed on circuit board 34. Then, the laser is applied to the metal-ink-on-conductor-body end section.

Figure 6:
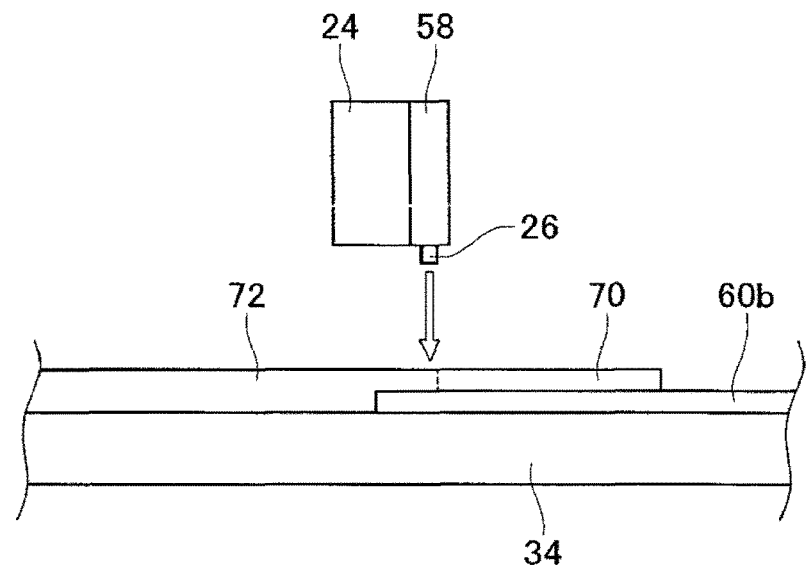
FIG. 6 is a side view showing a circuit board with metal ink on the circuit board and metal ink on the circuit board side end section of the conductor body baked.

When the laser is applied to the metal-ink-on-conductor-body end section, the laser strength is less than laser strength B and greater than laser strength A. Also, laser emitting device 26 traverses from the circuit board 34 side of the metal-ink-on-conductor-body end section to the opposite end section. In addition, laser emitting device 26 traverses from the opposite end section of the metal-ink-on-conductor-body end section to the original end section. Here, laser emitting device 26 repeatedly traverses to and from one end to the other end of the metal-ink-on-conductor-body end section until a laser corresponding to emission amount for conductor body Y has been applied to the metal-ink-on-conductor-body end section. By this, a laser corresponding to emission amount for conductor body Y is applied to the metal-ink-on-conductor-body end section, and by the metal-ink-on-conductor-body end section being baked, as shown in FIG. 6, wiring 72 is formed on the circuit board 34 end section of conductor body 60b.

Note that, the traverse speed of laser emitting device 26 when the laser is being applied to the metal-ink-on-conductor-body end section can be set to any speed, but the slower the traverse speed of laser emitting device 26, the fewer times the laser needs to be applied from one end to the other end of the metal-ink-on-conductor-body end section.

Next, a laser is applied to the portion of metal ink 70 dispensed on conductor body 60b other than the metal-ink-on-conductor-body end section. Here, the laser strength is B and the traverse speed of laser emitting device 26 is L/t1. By this, a laser corresponding to emission amount for conductor body Y is applied to the portion of metal ink 70 dispensed on conductor body 60b other than the metal-ink-on-conductor-body end section, and by the portion of metal ink 70 dispensed on conductor body 60b other than the metal-ink-on-conductor-body end section being baked, as shown in FIG. 5, wiring 72 is formed on conductor body 60b.

In this manner, by applying a laser multiple times to and from one end to the other end of the metal-ink-on-conductor-body end section, the same effects can the second alternative embodiment can be achieved.

Alternative Embodiment 4

Further, in the above embodiments, metal ink 70 is baked by a laser being directly applied to metal ink 70, but a laser may be applied to wiring 72 such that wiring 72 is heated, thereby baking metal ink 70 in contact with wiring 72.

Specifically, when the laser is applied to metal ink 70 dispensed on circuit board 34, laser emitting device 26 emits a laser with laser strength A while moving at speed L/t1. By this, a laser corresponding to emission amount for resin X is applied to metal ink 70 dispensed on circuit board 34, and, as shown in FIG. 4, wiring 72 is formed on circuit board 34. Then, a laser is applied to the portion of metal ink 70 dispensed on conductor body 60b other than the metal-ink-on-conductor-body end section.

Figure 7:
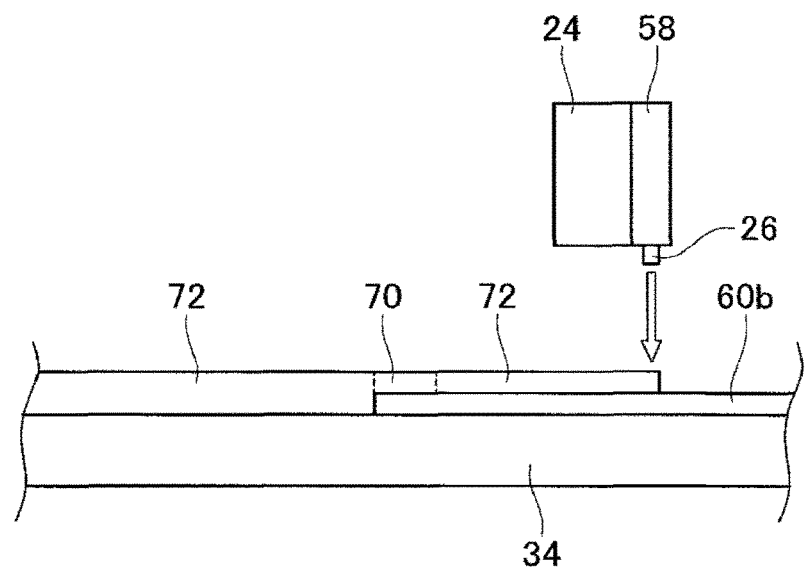
FIG. 7 is a side view showing a circuit board with metal ink on the circuit board and metal ink on a portion except for the circuit board side end section of the conductor body baked.

When a laser is applied to the portion of metal ink 70 dispensed on conductor body 60b other than the metal-ink-on-conductor-body end section, the laser strength is B and the traverse speed of laser emitting device 26 is L/t1. By this, a laser corresponding to emission amount for conductor body Y is applied to the portion of metal ink 70 dispensed on conductor body 60b other than the metal-ink-on-conductor-body end section, and as shown in FIG. 7, wiring 72 is formed at locations except for the portion corresponding to the metal-ink-on-conductor-body end section on conductor body 60b.

Figure 8:
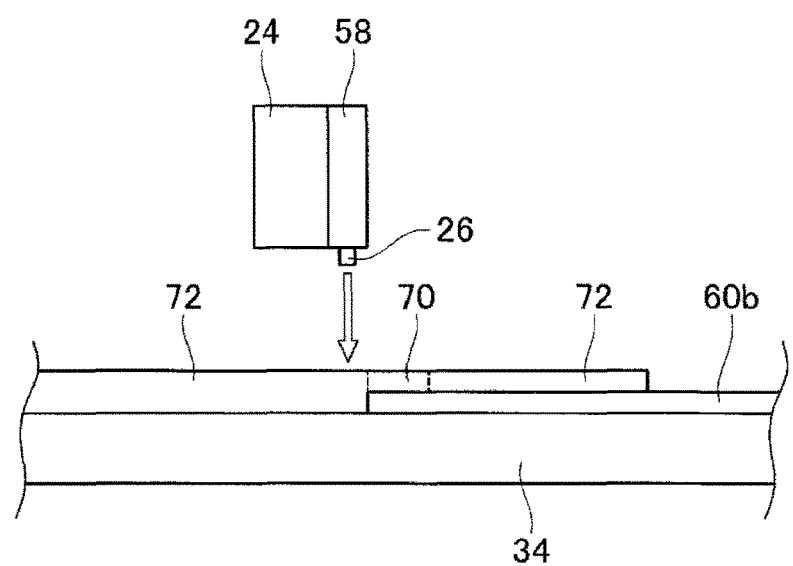
FIG. 8 is a side view showing a circuit board with a laser being applied to a conductor body side end section of the circuit board.

Next, the metal-ink-on-conductor-body end section is baked, but here, the laser is applied to the metal-ink-on-resin end section without being directly applied to the metal-ink-on-conductor-body end section. In detail, as shown in FIG. 8, laser emitting device 26 is moved above the metal-ink-on-resin end section. Then, the laser is applied to the metal-ink-on-resin end section. Note that, when the laser is applied to the metal-ink-on-resin end section, the wavelength of the laser is changed from 500 to 1500 nm to 200 to 600 nm. The laser with a wavelength 200 to 600 nm is easily absorbed by a mass of metal, and the metal-ink-on-resin end section has already been baked, and is wiring 72, that is, a mass of metal. Therefore, wiring 72 is heated by the laser being applied to wiring 72 that is the baked metal-ink-on-resin end section, and the heat is transmitted to the metal-ink-on-resin end section. By this, the metal-ink-on-conductor-body end section is baked, and wiring 72 is formed on the circuit board 34 end section of conductor body 60b. That is, as shown in FIG. 5, wiring 72 is formed on conductor body 60b.

In this manner; by heating wiring 72, even in a case in which metal ink 70 has been baked, it is possible to achiever the same effects as the above embodiments. Note that, when baking the metal-ink-on-conductor-body end section, a laser is applied to wiring 72 that is the baked metal-ink-on-resin end section, but the metal-ink-on-conductor-body end section can be heated even by applying a laser to the metal-ink-on-conductor-body end section of wiring 72 formed on conductor body 60b. However, in this case, even when wiring 72 formed on conductor body 60b is heated, because the heat dissipates to conductor body 60b, there is a worry that the metal-ink-on-conductor-body end section cannot be appropriately baked.

Note that, in the above embodiments, circuit board 34 is an example of a circuit board and a first substrate. Conductor bodies 60a and 60b are each an example of a second substrate. Metal ink 70 is an example of a metal-containing liquid. Further, the method of forming wiring straddling conductor bodies 60a and 60b and circuit board 34 is an example of a wiring forming method. The process of dispensing metal ink 70 straddling bodies 60a and 60b and circuit board 34 is an example of an applying process. The process of baking metal ink 70 dispensed on circuit board 34 is an example of a baking process and a first baking process.

The process of baking metal ink 70 dispensed on conductor bodies 60a and 60b is an example of a baking process and a second baking process.

Further, the present disclosure is not limited to the above example embodiments, and various changed or improved methods of embodiment are possible based on the knowledge of someone skilled in the art. Specifically, for example, in the above embodiments, a laser is applied to metal ink 70 dispensed on conductor bodies 60a and 60b and circuit board 34 so as to bake metal ink 70, but a laser may be applied to metal ink dispensed on various substrate materials other than conductor bodies 60a and 60b and circuit board 34 so as to bake metal ink 70.

Also, in the above embodiments, the laser emission amount per unit of area is changed based on the thermal conductivity of the metal on which metal ink 70 is dispensed, but the laser emission amount per unit of area may be changed based on the volume or thermal capacity of the material on which metal ink 70 is dispensed. Note that, the larger the volume of the material on which metal ink 70 is dispensed, the larger the laser emission amount per unit of area, and the larger the thermal capacity of the material on which metal ink 70 is dispensed, the larger the laser emission amount per unit of area.

Also, in alternative embodiment 3 above, after the laser is applied multiple times to the metal-ink-on-conductor-body end section, the laser is applied to the portion of metal ink 70 on conductor bodies 60a and 60b other than the metal-ink-on-conductor-body end section; however; the laser may be applied multiple times to metal-ink-on-conductor-body end section after the laser is applied to the portion of metal ink 70 on conductor bodies 60a and 60b other than the metal-ink-on-conductor-body end section.

Also, in alternative embodiment 3 above, the wavelength of the laser applied to the metal-ink-on-resin end section is 200 to 600 nm, but a laser with a wavelength 200 to 1500 may be applied to the metal-ink-on-resin end section.

Further, in the above embodiments, for the boundary between metal ink 70 dispensed on conductor bodies 60a and 60b and metal ink 70 dispensed on circuit board 34, the laser strength or the traverse speed of laser emitting device 26 is changed; however, the laser strength or the traverse speed of laser emitting device 26 may be changed for the circuit board 34 side end section of metal ink 70 dispensed on conductor bodies 60a and 60b, that is, for the metal-ink-on-conductor-body end section, or for the conductor body 60a and 60b side end section of metal ink 70 dispensed on circuit board 34, that is, the metal-ink-on-resin end section.

REFERENCE SIGNS LIST

34: circuit board (first substrate); 60a, 60b: conductor body (second substrate); 70: metal ink

The invention claimed is:

1. A wiring forming method comprising:
   forming wiring on a substrate by baking a metal-containing liquid that is a liquid containing metal particles, wherein the forming includes
   applying the metal-containing liquid straddling multiple different types of substrate materials, and
   baking the metal-containing liquid applied during the applying with a laser, wherein
   the laser emission amount per unit of area is changed based on the substrate material for each of the multiple substrates when baking the metal-containing liquid.

2. The wiring forming method according to claim 1, wherein
   the laser emission amount per unit of area is changed based on at least one of the thermal conductivity, the thermal capacity, or the volume of the substrate for each of the multiple substrates when baking the metal-containing liquid.

3. The wiring forming method according to claim 1, wherein
   the applying includes applying the metal-containing liquid straddling a first substrate and a second substrate that has at least one of a higher thermal conductivity than the thermal conductivity of the first substrate, a higher thermal capacity than the thermal capacity of the first substrate, or a larger volume than the volume of the first substrate, and
   the baking includes
   a first baking process of baking the metal-containing liquid applied on the first substrate by applying the laser corresponding to a first set emission amount, which is a laser emission amount per unit of area set according to the first substrate, and
   a second baking process of, after the first baking processing is complete, baking the metal-containing liquid applied on the second substrate by applying the laser corresponding to an emission amount that is equal to or less than a second set emission amount, which is a laser emission amount per unit of area set according to the second substrate, and greater than the first set emission amount.

4. The wiring forming method according to claim 3, wherein
   the second baking process includes baking the metal-containing liquid applied on the second substrate by applying the laser corresponding to the second set emission amount to the metal-containing liquid applied on the second substrate.

5. The wiring forming method according to claim 3, wherein
   the second baking process includes baking the metal-containing liquid applied on the second substrate by applying, multiple times, the laser corresponding to an emission amount smaller than the second set emission amount and greater than the first set emission amount to the metal-containing liquid applied on the second substrate.

6. The wiring forming method according to claim 3, wherein
   the second baking process includes
   baking a substrate-side end section that is an end section on the first substrate side within the metal-containing liquid applied on the second substrate by applying, multiple times, the laser corresponding to an emission amount smaller than the second set emission amount and greater than the first set emission amount to the substrate-side end section, and
   baking a portion within the metal-containing liquid applied on the second substrate excluding the substrate-side end section by applying the laser corresponding to second set emission amount to the section within the metal-containing liquid applied on the second substrate excluding the substrate-side end section.

7. The wiring forming method according to claim 3, wherein
   the wavelength of the laser applied to the metal-containing liquid applied on the first substrate and the second substrate is 500 to 1500 nm.

8. The wiring forming method according to claim 3, wherein the second baking process includes baking a portion within the metal-containing liquid applied on the second substrate excluding a substrate-side end section that is an end section on the first substrate side within the metal-containing liquid applied on the second substrate by applying the laser corresponding to second set emission amount to the section within the metal-containing liquid applied on the second substrate excluding the substrate-side end section, and then baking the substrate-side end section within the metal-containing liquid applied on the second substrate by applying the laser with a wavelength of 200 to 1500 nm to the end section on the second substrate side of the wiring formed by the baking of the metal-containing liquid on the first substrate.

* * * * *